United States Patent
Li et al.

(10) Patent No.: US 7,042,049 B2
(45) Date of Patent: May 9, 2006

(54) COMPOSITE ETCHING STOP IN SEMICONDUCTOR PROCESS INTEGRATION

(75) Inventors: Lain-Jong Li, Hualien (TW); Tien-I Bao, Hsin-Chu (TW); Shwang-Ming Jeng, Hsin-Chu (TW); Syun-Ming Jang, Hsin-Chu (TW); Jun-Lung Huang, Hsin-Chu (TW); Jeng-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 91 days.

(21) Appl. No.: 10/823,149

(22) Filed: Apr. 13, 2004

(65) Prior Publication Data

US 2004/0191977 A1    Sep. 30, 2004

Related U.S. Application Data

(63) Continuation of application No. 09/970,787, filed on Oct. 5, 2001, now Pat. No. 6,753,260.

(51) Int. Cl.
*H01L 29/76*    (2006.01)
*H01L 29/94*    (2006.01)
*H01L 31/62*    (2006.01)
*H01L 31/113*    (2006.01)
*H01L 31/119*    (2006.01)

(52) U.S. Cl. .................. 257/334; 257/649; 257/652

(58) Field of Classification Search ............. 257/334, 257/347, 520, 613, 632, 639, 640, 641, 642, 257/643, 646, 648, 649, 652
See application file for complete search history.

(56) References Cited

U.S. PATENT DOCUMENTS

| | | | |
|---|---|---|---|
| 5,585,304 A | 12/1996 | Hayashi et al. | 437/62 |
| 5,969,422 A * | 10/1999 | Ting et al. | 257/762 |
| 5,990,015 A * | 11/1999 | Lin et al. | 438/706 |
| 6,127,262 A | 10/2000 | Huang et al. | 438/634 |
| 6,209,484 B1 | 4/2001 | Huang et al. | 118/723 E |
| 6,753,260 B1 * | 6/2004 | Li et al. | 438/700 |

* cited by examiner

*Primary Examiner*—David Nhu
(74) *Attorney, Agent, or Firm*—Haynes and Boone, LLP

(57) ABSTRACT

A new method of forming a composite etching stop layer is described. An etching stop layer is deposited on a substrate wherein the etching stop layer is selected from the group consisting of: silicon carbide, silicon nitride, SiCN, SiOC, and SiOCN. A TEOS oxide layer is deposited by plasma-enhanced chemical vapor deposition overlying the etching stop layer. The composite etching stop layer has improved moisture resistance, better etching selectivity, and lower dielectric constant than other etching stop layers.

20 Claims, 3 Drawing Sheets

COMPOSITE ETCHING STOP IN SEMICONDUCTOR PROCESS INTEGRATION

This application is a continuation of Ser. No. 09/970,787 dated Oct. 5, 2001, U.S. Pat. No. 6,753,260.

BACKGROUND OF THE INVENTION (1) Field of the Invention

The invention relates to a method of metallization in the fabrication of integrated circuits, and more particularly, to a method of forming an improved etch stop layer for metallization in the manufacture of integrated circuits.

(2) Description of the Prior Art

In a common application for integrated circuit fabrication, a contact/via opening is etched through an insulating layer to an underlying conductive area to which electrical contact is to be made. A conducting layer material is deposited within the contact/via opening. The damascene and dual damascene processes have become a future trend in metallization. Trenches or vias and trenches are etched in an insulating layer. The trenches or vias and trenches are inlaid with metal to complete the contacts. In all of these processes, etch stop layers are required to accurately form the trenches and vias. A silicon carbide etching stop layer has a good copper diffusion barrier capability and a lower dielectric constant than silicon nitride. Nevertheless, moisture resistance of the silicon carbide is worse than that of silicon nitride. Also, low dielectric constant (k) material to silicon carbide etching selectivity needs to be improved.

U.S. Pat. Nos. 6,127,262 and 6,209,484 both to Huang et al shows an etching stop and anti-reflective coating film comprising silicon oxynitride deposited using a PECVD process. U.S. Pat. No. 5,585,304 to Hayashi et al teaches a silicon carbide or silicon nitride etching stop in a transparent layer process.

SUMMARY OF THE INVENTION

A principal object of the present invention is to provide an effective and very manufacturable method of forming a composite etching stop layer in the fabrication of integrated circuit devices.

Another object of the invention is to provide a method of forming a composite etching stop layer wherein the top TEOS oxide layer prevents moisture attack to the bottom layer.

A further object of the invention is to provide a method of forming a composite etching stop layer having an improved selectivity of a low-k material to the composite etching stop material.

Yet another object of the invention is to provide a method of forming a composite etching stop layer having a lowered dielectric constant.

A still further object of the invention is to provide a method of forming a composite etching stop layer comprising a bottom etching stop layer and a top TEOS oxide layer.

In accordance with the objects of this invention a new method of forming a composite etching stop layer is achieved. An etching stop layer is deposited on a substrate wherein the etching stop layer is selected from the group consisting of: silicon carbide, silicon nitride, SiCN, and SiOCN. A TEOS oxide layer is deposited by plasma-enhanced chemical vapor deposition overlying the etching stop layer to complete the composite etching stop layer.

Also in accordance with the objects of the invention, a method for fabricating an integrated circuit device using a novel composite etching stop layer is achieved. A composite etching stop layer is deposited overlying a substrate. An etching stop layer selected from the group consisting of: silicon carbide, silicon nitride, SiCN, SiOCN, SiOC, and bis-benzocyclobutene (p-BCB) is deposited over the substrate. A TEOS oxide layer is deposited by plasma-enhanced chemical vapor deposition overlying the etching stop layer to complete the composite etching stop layer. A dielectric layer is deposited overlying the composite etching stop layer. An opening is etched through the dielectric layer stopping at the composite etching stop layer. The composite etching stop layer within the opening is removed. The opening is filled with a conducting layer to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
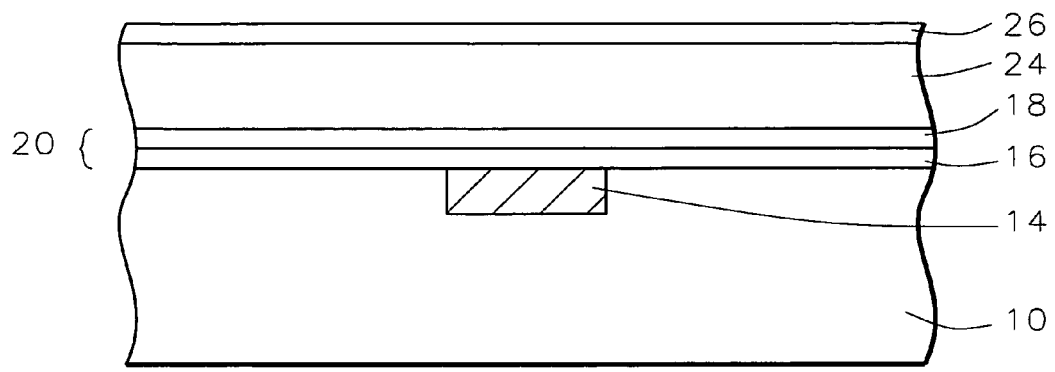
FIGS. 1 through 5 schematically illustrate in cross-sectional representation a preferred embodiment of the present invention.

The present invention provides a method for forming a composite etching stop layer in the fabrication of integrated circuits. The drawing figures illustrate a dual damascene metallization method in which the composite etching stop layer of the present invention is to be used. It will be understood by those skilled in the art that the process of the present invention is not limited to the embodiments described in detail herein, but may be used in any application in which such a composite etching stop layer would be advantageous.

Referring now more particularly to FIG. 1, there is illustrated a portion of a partially completed integrated circuit device. There is shown a semiconductor substrate 10, preferably composed of monocrystalline silicon. Semiconductor device structures, such as gate electrodes and source and drain regions, not shown, may be formed in and on the semiconductor substrate. These semiconductor device structures are covered with an insulating layer such as silicon oxide. The silicon substrate, semiconductor device structures and insulating layer thereover are represented by 10 in FIG. 1. A metal line 14, such as copper, aluminum, or the like, is formed within the substrate 10, contacting one of the semiconductor device structures, not shown. In the illustrated dual damascene process, a damascene opening is to be made to this metal line 14.

The composite etching stop layer of the present invention adds a plasma-enhanced chemical vapor deposited (PECVD) tetraethoxysilane (TEOS) oxide layer overlying a conventional etching stop layer such as silicon nitride or silicon carbide. As shown in FIG. 1, a first etching stop layer 16 is deposited over the substrate surface. The first layer comprises silicon nitride, silicon carbide, SiCN, SiOCN, SiOC, or bis-benzocyclobutene (p-BCB) deposited by plasma-enhanced chemical vapor deposition (PECVD) or a spin-on method, for example, to a thickness of between about 200 and 600 Angstroms. Then, a second layer of TEOS oxide 18 is deposited over the etching stop layer 16 by PECVD at a lower temperature of less than about 450° C.

to a thickness of between about 150 and 500 Angstroms. This completes the composite etching stop layer 20.

Now, a dielectric layer 24, composed of silicon dioxide or a low dielectric constant material is deposited over the composite etching stop layer 20 to a thickness of between about 3000 and 10,000 Angstroms. The low dielectric constant material layer 24 may comprise a carbon-doped silicate glass, polyarylene ethers (PAE), polyimides, fluorine-doped silicate glass (FSG), and so on.

Figure 2:
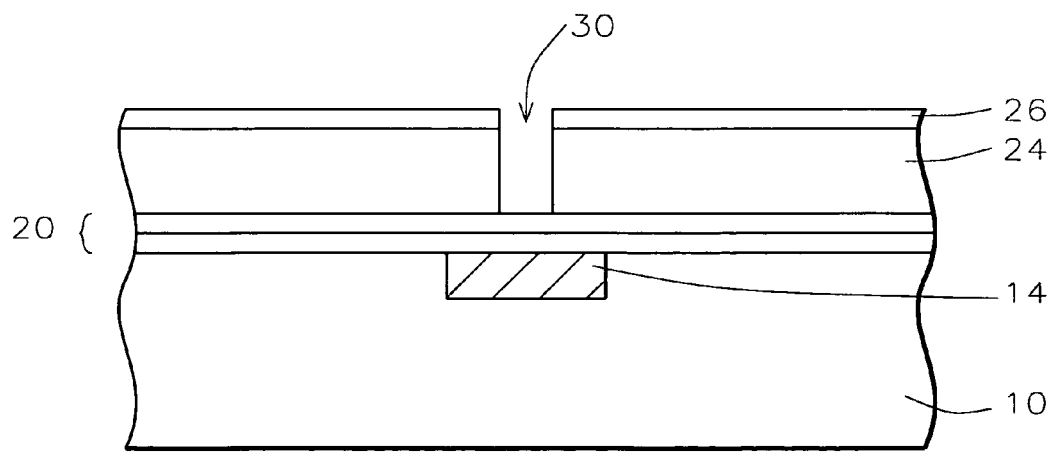
Figure 3:
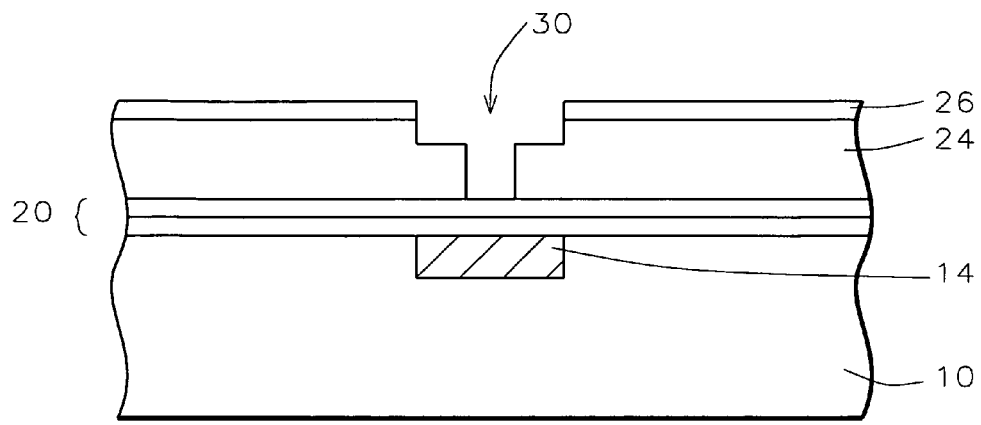

An anti-reflective coating or hard mask layer 26 is formed over the dielectric layer 24. This is covered with a photoresist mask, for example, not shown. A dual damascene opening is etched through the dielectric layer 24. For example, FIGS. 2 and 3 illustrate a via-first dual damascene process. However, it will be understood by those skilled in the art that other dual damascene processes can be used. Furthermore, a single damascene process could be used to form the single damascene opening 30 illustrated in FIG. 2. The process could be continued from that point to etch through the etching stop layer 20 and fill the single damascene opening.

FIG. 3 illustrates the dual damascene opening 30. Etching stops at the top layer 18 of the composite etching stop layer 20.

Figure 4:
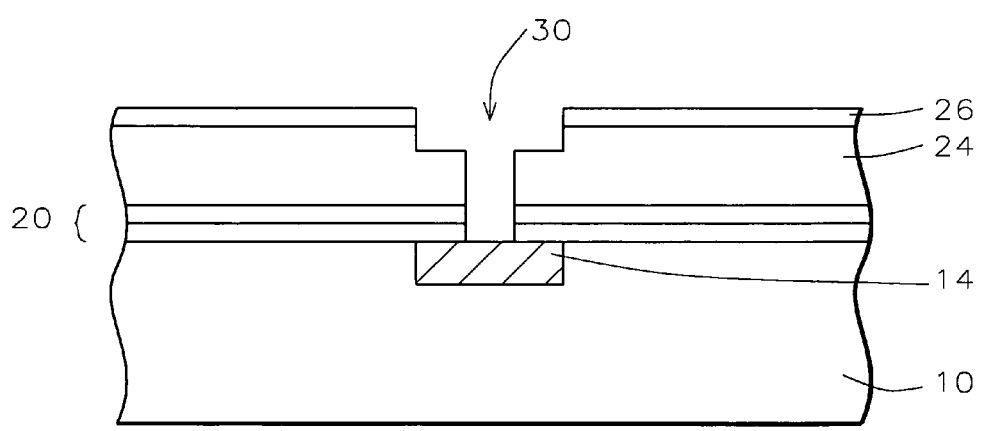

Referring now to FIG. 4, the composite etching stop layer 20 is removed where it is exposed within the damascene opening 30.

Figure 5:
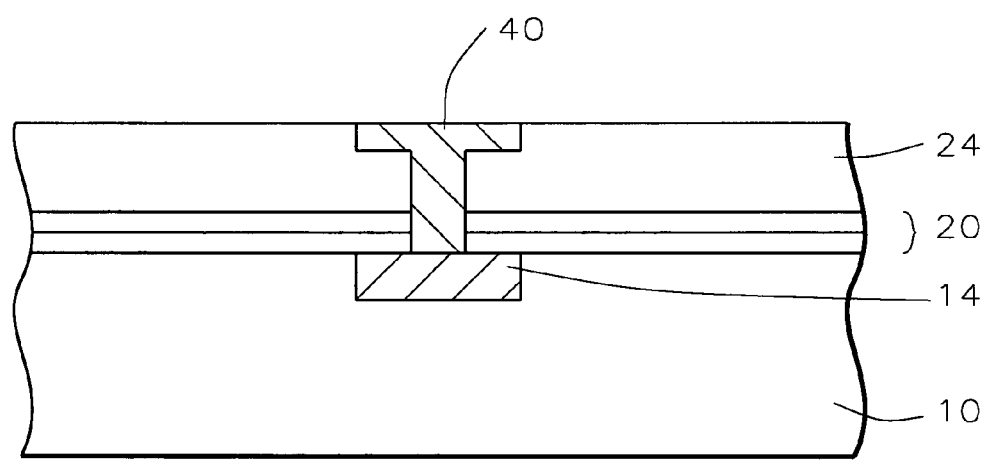

Referring now to FIG. 5, a metal layer is formed within the dual damascene opening according to a conventional process. For example, aluminum or copper may be deposited within the opening 30 and polished to complete the metal inlay 40. Processing continues as is conventional in the art to complete fabrication of the integrated circuit device.

The benefits of the composite etching stop layer of the present invention include the following:

1) The composite etching stop layer has a lower dielectric constant. For example, a 500 Angstrom thick silicon carbide layer has a dielectric constant of 5. A composite layer having a 250 Angstrom thick silicon-carbide layer underlying a 250 Angstrom thick PE-TEOS layer has an effective dielectric constant of 4.5.

2) PE-TEOS has better moisture prevention than silicon carbide (SiC) or SiOCN. The inventors performed a moisture resistance test on the composite etching stop layer of the present invention and on various other layers. The moisture resistance test structure comprised a 10,000 Angstroms fluorosilicate glass (FSG) layer on a silicon wafer. The etching stop layers to be tested were deposited over the FSG layer. For the moisture resistance test, the test wafer was subjected to a standard pressure cook test in a steam ambient at 110° C. and 280 atmospheres of pressure to test moisture penetration. Then an alloying step at 400° C. was performed to drive out the moisture. Si—F bonding was observed after this test. Normal Si—F bonding is 940 (cm$^{-1}$) wavenumber (unit of vibration energy). Si—F bonding has a vibration frequency depending upon the amount of water present. A peak shift in the vibration frequency can be observed when moisture passes through the etching stop layer, indicating a failure of the etching stop.

Si—F bonding was measured after the test described above for each test wafer, as shown in Table 1.

TABLE 1

| film | bond before test | bond after test | shift |
|---|---|---|---|
| FSG (no etching stop) | 939.331 | 931.616 | −7.715 |
| FSG + PEOX | 939.331 | 931.616 | −7.715 |
| FSG + SiC | 939.331 | 931.616 | −7.715 |
| FSG + PE-TEOS | 935.474 | 935.474 | 0.000 |
| FSG + PE-SiN | 939.331 | 937.402 | −1.929 |

The first test wafer is one with no etching stop layer, as a reference. The next two test wafers use a PE-oxide capping layer or a silicon carbide etching stop. Both of these options show unacceptable shifts in Si—F bonding due to moisture penetration. The fourth test wafer used the PE-TEOS cap of the present invention. This wafer showed no shift in Si—F bonding indicating no moisture penetration. The last test wafer had a silicon nitride etching stop. This layer showed minimal moisture penetration, but the dielectric constant of a silicon nitride layer is too high.

A ranking of materials based on their moisture resistance is as follows:

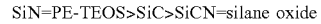

SiN=PE-TEOS>SiC>SiCN=silane oxide

The inventors also tested the moisture resistance of a patterned wafer. The test wafer has seven layers of metallurgy. The dielectric layers comprised a low-k carbon-doped silicate glass. Metal width was 0.21 µm and spacing between metal lines was 0.2 µm. The metal lines were formed in a serpentine-comb structure. Line-line capacitance (in Faradays) was measured at the fifth metal level, after completion of planarization of the seventh level metallization, after subsequently heating-the wafer at 400° C. for two hours to dry any moisture in the atmosphere, and finally three days later. Table 2 illustrates the capacitance measurements for a wafer using silicon carbide as an etching stop (1) and for a wafer using the composite etching stop of the invention—silicon carbide with an overlying PE-TEOS layer (2).

TABLE 2

| wafer | after CMP | after heating | after 3 days |
|---|---|---|---|
| 1 | 1.69 E-11 | 1.70 E-11 | 1.72 E-11 |
| 2 | 1.48 E-11 | 1.48 E-11 | 1.46 E-11 |

It can be seen from Table 2 that while capacitance increases for the conventional etching stop (wafer 1) by 5%, there is no increased capacitance for the composite etching stop of the invention (wafer 2), even after three days.

3) The composite etch stop layer has comparable (or better) etching selectivity to silicon carbide. Using the same etching chemistry, the low-k material to etching stop material selectivity can be improved from 5 for silicon carbide to 5.5 for the composite etching stop layer of the invention. The via etching can easily stop at the PE-TEOS layer when etching carbon-doped oxides. The same result occurs for other low-k dielectric materials.

4) The process of the invention eliminates photoresist scum. A problem with silicon carbide is that the NH$_x$ base of silicon carbide can react with a photoresist material to form a "scum" of reactant material around the top of the damascene opening. When the silicon carbide is capped with the TEOS layer, the NH$_x$ cannot escape from the silicon carbide; therefore, the damascene openings are clear.

The process of the present invention provides a composite etching stop layer comprising a PE-TEOS layer overlying an etching stop material. This composite layer is moisture resistant, has a better etching selectivity, has a lower effective dielectric constant, increases the etching process window, and covers more film variation than the prior art.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:
a composite etching stop layer overlying a metal line in a substrate wherein said composite etching stop layer comprises a TEOS oxide layer overlying an etching stop layer;
a dielectric layer overlying said composite etching stop layer; and
a conducting layer lying in an opening through said dielectric layer and said composite etching stop layer to said metal line.

2. The device according to claim 1 wherein said substrate comprises semiconductor device structures including gate electrodes and associated source and drain regions and metallization formed in and on a silicon substrate.

3. The device according to claim 1 wherein said composite etching stop layer comprises:
said etching stop layer selected from the group consisting of: silicon carbide, silicon nitride, SiCN, SiOC, SiOCN, and p-BCB; and
said TEOS oxide layer overlying said etching stop layer wherein said TEOS oxide layer provides moisture resistance to said composite etching stop layer.

4. The device according to claim 1 wherein said composite etching stop layer has a thickness of between about 300 and 1000 Angstroms.

5. The device according to claim 1 wherein said etching stop layer has a thickness of between about 200 and 600 Angstroms.

6. The device according to claim 3 wherein said TEOS oxide layer has a thickness of between about 150 and 500 Angstroms.

7. The device according to claim 1 wherein said dielectric layer is selected from the group consisting of: carbon-based silicate glass, polyarylene ethers, polyimides, and fluorine-doped silicate glass.

8. A composite etching stop layer comprising:
an etching stop layer on a copper line in a substrate wherein said etching stop layer is selected from the group consisting of: silicon carbide, silicon nitride, SiCN, SiOC, SiOCN, and p-BCB; and
a TEOS oxide layer overlying said etching stop layer.

9. The device according to claim 8 wherein said substrate comprises semiconductor device structures including gate electrodes and associated source and drain regions formed in and on a silicon substrate.

10. The device according to claim 8 wherein said composite etching stop layer has a thickness of between about 300 and 1000 Angstroms.

11. The device according to claim 8 wherein said etching stop layer has a thickness of between about 200 and 600 Angstroms.

12. The device according to claim 8 wherein said TEOS oxide layer has a thickness of between about 150 and 500 Angstroms.

13. The device according to claim 8 further comprising:
a dielectric layer overlying said composite etching stop layer; and
a conducting layer in an opening in said dielectric layer and said composite etching stop layer to said copper line.

14. The device according to claim 13 wherein said dielectric layer is selected from the group consisting of: carbon-based silicate glass, polyarylene ethers, polyimides, and fluorine-doped silicate glass.

15. An integrated circuit device comprising:
a composite etching stop layer overlying a copper line in a substrate wherein said composite etching stop layer comprises:
a silicon carbide etching stop layer; and
a TEOS oxide layer overlying said silicon carbide etching stop layer;
a dielectric layer overlying said composite etching stop layer; and
a conducting layer filling an opening in said dielectric layer and said composite etching stop layer to said copper line.

16. The device according to claim 15 wherein said substrate comprises semiconductor device structures including gate electrodes and associated source and drain regions formed in and on a silicon substrate.

17. The device according to claim 15 wherein said composite etching stop layer has a thickness of between about 300 and 1000 Angstroms.

18. The device according to claim 15 wherein said silicon carbide etching stop layer has a thickness of between about 200 and 600 Angstroms.

19. The device according to claim 15 wherein said TEOS oxide layer has a thickness of between about 150 and 500 Angstroms.

20. The device according to claim 15 wherein said dielectric layer is selected from the group consisting of: carbon-based silicate glass, polyarylene ethers, polyimides, and fluorine-doped silicate glass.

* * * * *